United States Patent
Hsiao et al.

[11] Patent Number: 6,077,778
[45] Date of Patent: Jun. 20, 2000

[54] METHOD OF IMPROVING REFRESH TIME IN DRAM PRODUCTS

[75] Inventors: Yung-Kuan Hsiao, Hsinchu; Min-Hsiung Chiang, Taipei; Yuan-Chang Huang, Hsin-Chu, all of Taiwan

[73] Assignee: Taiwan Semiconductor Manufacturing Company, Hsin-Chu, Taiwan

[21] Appl. No.: 08/843,946

[22] Filed: Apr. 17, 1997

[51] Int. Cl.[7] .................................. H01L 21/44
[52] U.S. Cl. .................. 438/656; 438/660; 438/669; 438/618; 438/621; 438/625; 438/629; 438/637
[58] Field of Search .................... 438/656, 660, 438/669, 687, 688, 625, 386, 629, 637, 618, 621

[56] References Cited

U.S. PATENT DOCUMENTS

| | | | |
|---|---|---|---|
| 3,771,219 | 11/1973 | Tuzi et al. | 438/461 |
| 4,212,100 | 7/1980 | Paivinen et al. | 438/278 |
| 4,371,403 | 2/1983 | Ikubo et al. | 438/143 |
| 4,942,451 | 7/1990 | Tamaki et al. | 257/742 |
| 5,281,555 | 1/1994 | Cho | 438/625 |
| 5,420,070 | 5/1995 | Matsuura et al. | 437/190 |
| 5,488,014 | 1/1996 | Harada et al. | 438/625 |
| 5,650,349 | 7/1997 | Prall et al. | 438/251 |
| 5,834,815 | 11/1998 | Cheng et al. | 257/379 |
| 5,851,873 | 12/1998 | Murai et al. | 438/253 |
| 5,882,984 | 3/1999 | Fan et al. | 438/440 |

Primary Examiner—Carl Whitehead, Jr.
Assistant Examiner—Khanh Duong
Attorney, Agent, or Firm—George O. Saile; Stephen B. Ackerman

[57] ABSTRACT

An improved and new method for forming a metal conductor interconnection structure on a semiconductor substrate containing DRAM devices has been developed. The method utilizes a thermal anneal in a flowing gas mixture of nitrogen and hydrogen following patterning of the metal conductor interconnection structure and results in DRAM devices having improved mean refresh time (time between refresh cycles).

2 Claims, 2 Drawing Sheets

METHOD OF IMPROVING REFRESH TIME IN DRAM PRODUCTS

BACKGROUND OF THE INVENTION (1) Field of the Invention

This invention relates to a method of fabrication used for semiconductor circuit devices, and more specifically to an improved method of forming the metallization interconnection layers in DRAM (Dynamic Random Access Memory) products.

(2) Description of Related Art

DRAM (Dynamic Random Access Memory) products make use of very low leakage associated with gate circuits and junctions of MOS devices. Usually the leakage currents are small enough to permit the circuit's parasitic capacitances to exhibit time constants of many milliseconds. And, long time constants may be used to provide temporary storage, which may be made permanent by appropriate cyling or refresh operations. It is, therefore, desirable that the refresh time (time between refresh cycles) be as long as possible in order to minimize the necessity to periodically restore charge storage in the memory cells. More advanced DRAM products require longer and longer refresh times to ensure quality and advanced memory functionality.

In current DRAM products, such as 16M DRAM, it is desirable that the mean refresh time be greater than 1200 milliseconds. However, using current fabrication processing technologies, the typical refresh time is about 400–600 milliseconds. This results in refresh time test failure and becomes a major yield detractor when manufacturing advanced DRAM products such as 16M DRAM, 64M DRAM and 256M DRAM. Improvements to DRAM manufacturing processes which can increase the refresh time are, therefore, desirable. Such process improvements should, also, not adversely impact overall process yield and cost.

U.S. Pat. No. 5,420,070 entitled "Manufacturing Method of Interconnection Structure of Semiconductor Device" granted May 30, 1995 to Megumi Matsuura et al describes a semiconductor manufacturing process in which a thermal treatment is made to a tungsten-titanium interface to cause reaction of the tungsten and the titanium layers. The result is an improved metallization structure having stable resistance at contacts and high process yield.

SUMMARY OF THE INVENTION

One object of the present invention is to provide an improved method of fabricating a metal conductor interconnection structure on a semiconductor substrate containing DRAM devices, which results in DRAM devices having improved refresh time (time between refresh cycles).

Another object of the present invention is to provide a new and improved process for fabricating a metal conductor interconnection structure on a semiconductor substrate containing DRAM devices, which results in DRAM devices having mean refresh times of at least 1200 milliseconds.

A further object of the present invention is to provide a new and improved process for fabricating a metal conductor interconnection structure on a semiconductor substrate containing DRAM devices, which results in DRAM devices having improved refresh time; the overall process having high manufacturing yield and low cost.

In accordance with the present invention, the above and other objectives are realized by using a method of forming a metal conductor interconnection structure on a semiconductor substrate containing DRAM devices, comprising the steps of: providing said semiconductor substrate containing DRAM devices; forming an insulating layer on the semiconductor substrate; forming contact holes in the insulating layer, exposing a plurality of underlying regions of the DRAM devices; depositing a metal conductor layer on the insulating layer and the underlying regions to substantially cover the insulating layer and the underlying regions; forming an interconnection structure pattern in the metal conductor layer; and applying a thermal process in a flowing gas mixture of nitrogen and hydrogen.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method for fabricating a metal conductor interconnection structure on a semiconductor substrate containing DRAM devices, which results in DRAM devices having improved mean refresh time (time between refresh cycles), will now be described in detail.

Figure 1:
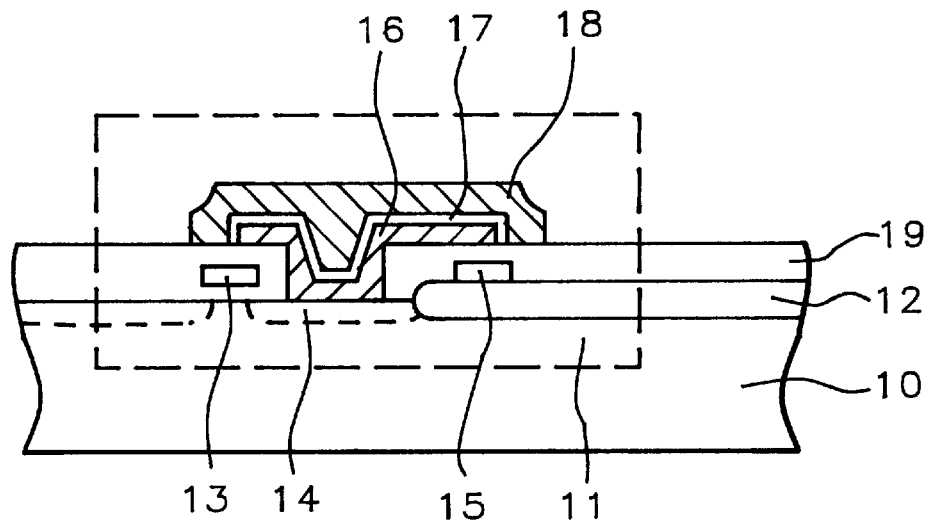
FIG. 1, which schematically, in cross-sectional representation, illustrates a conventional DRAM cell formed on a silicon semiconductor substrate.

Referring to FIG. 1, DRAM cell 11 is formed on silicon semiconductor substrate 10. DRAM cell 11 is formed of an element separator oxide layer 12, a transfer gate electrode 13, an impurity diffusion layer 14, a word line 15, a memory node 16, a capacitor insulating layer 17, a cell plate 18 and a dielectric layer 19. The DRAM cell 11 is formed by conventional semiconductor circuit manufacturing processes.

Figure 2:
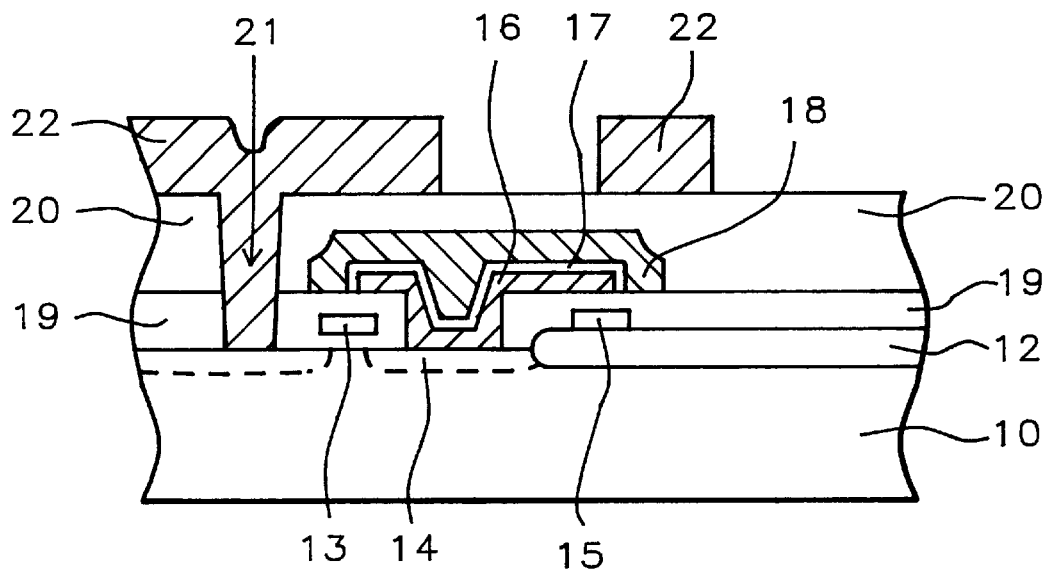
FIG. 2, which schematically in cross-sectional representation, illustrates a conventional DRAM cell, as illustrated in FIG. 1, following formation of a metal conductor interconnection structure.

Referring to FIG. 2, insulating layer 20 is formed on the entire surface of the silicon semiconductor substrate 10 on which DRAM cell 11 is formed. The insulating layer 20 may be silicon oxide deposited by LPCVD (Low Pressure Chemical Vapor Deposition) or PECVD (Plasma Enhanced Chemical Vapor Deposition), at a temperature between about 300 to 1000° C., to a thickness between about 2000 and 10,000 Angstroms, using TEOS (tetraethylorthosilicate) gas at a flow between about 0.1 and 2 slm. Contact holes 21 are formed in the insulating layer 20 using conventional lithographic and plasma etching techniques. Metal conductor layer 22 is deposited by conventional methods and etched to form a metal conductor interconnection structure pattern, as shown. The metal conductor layer 22 may be tungsten deposited by a CVD process, at a temperature between about 300 and 500° C., to a thickness between about 2000 and 8000 Angstroms, using $WF_6$ gas at a flow between about 5 and 200 sccm. Formation of the tungsten interconnection structure is by conventional lithographic techniques and plasma etching in a conventional metal etcher apparatus using $SF_6$ and $N_2$ gases. Alternately, the metal conductor layer 22 may be aluminum deposited to a thickness between about 2000 and 10,000 Angstroms. Formation of the aluminum interconnection structure is by conventional lithographic techniques and plasma etching in a conventional metal etcher apparatus using $Cl_2$ and $BCl_3$ gases.

Following formation of the metal conductor interconnection structure pattern, the semiconductor substrate is annealed in a flowing gas mixture of nitrogen and hydrogen. The annealing process comprises the step of heating at a temperature between about 400 and 500° C. for a time between about 30 and 90 min. It is important that the temperature of the anneal step be between about 400 and 500° C. for a time greater than about 20 to 30 min. A flowing gas mixture of nitrogen and hydrogen is present during the anneal step and the gas mixture has a flow rate of nitrogen between about 5 and 30 slm (standard liters per min) and a flow rate of hydrogen between about 0.5 and 5 slm (standard liters per min). The ratio of the flow rate of the nitrogen to the flow rate of the hydrogen is not critical, but may be between about 2 to 1 and 15 to 1.

The anneal of the metal conductor interconnection structure pattern in the flowing gas mixture of nitrogen and hydrogen results in a significant improvement in mean refresh time for DRAM products formed with a metal conductor interconnection structure pattern. TABLE 1 shows the mean refresh time in milliseconds for DRAM devices formed with a tungsten interconnection structure pattern as a function of anneal treatment in a mixture of nitrogen and hydrogen.

TABLE 1

| Anneal History | Mean Refresh Time |
| --- | --- |
| No anneal | 700 ms |
| $N_2/H_2$ anneal at 450° C. | 1400 ms |
| No anneal | 600 ms |
| 30 min anneal, $N_2/H_2$, 450° C. | 1200 ms |
| 60 min anneal, $N_2/H_2$, 450° C. | 1200 ms |
| 90 min anneal, $N_2/H_2$, 450° C. | 1200 ms |
| No anneal | 650 ms |
| $N_2/H_2$ anneal at 450° C. | 1300 ms |

Figure 3:
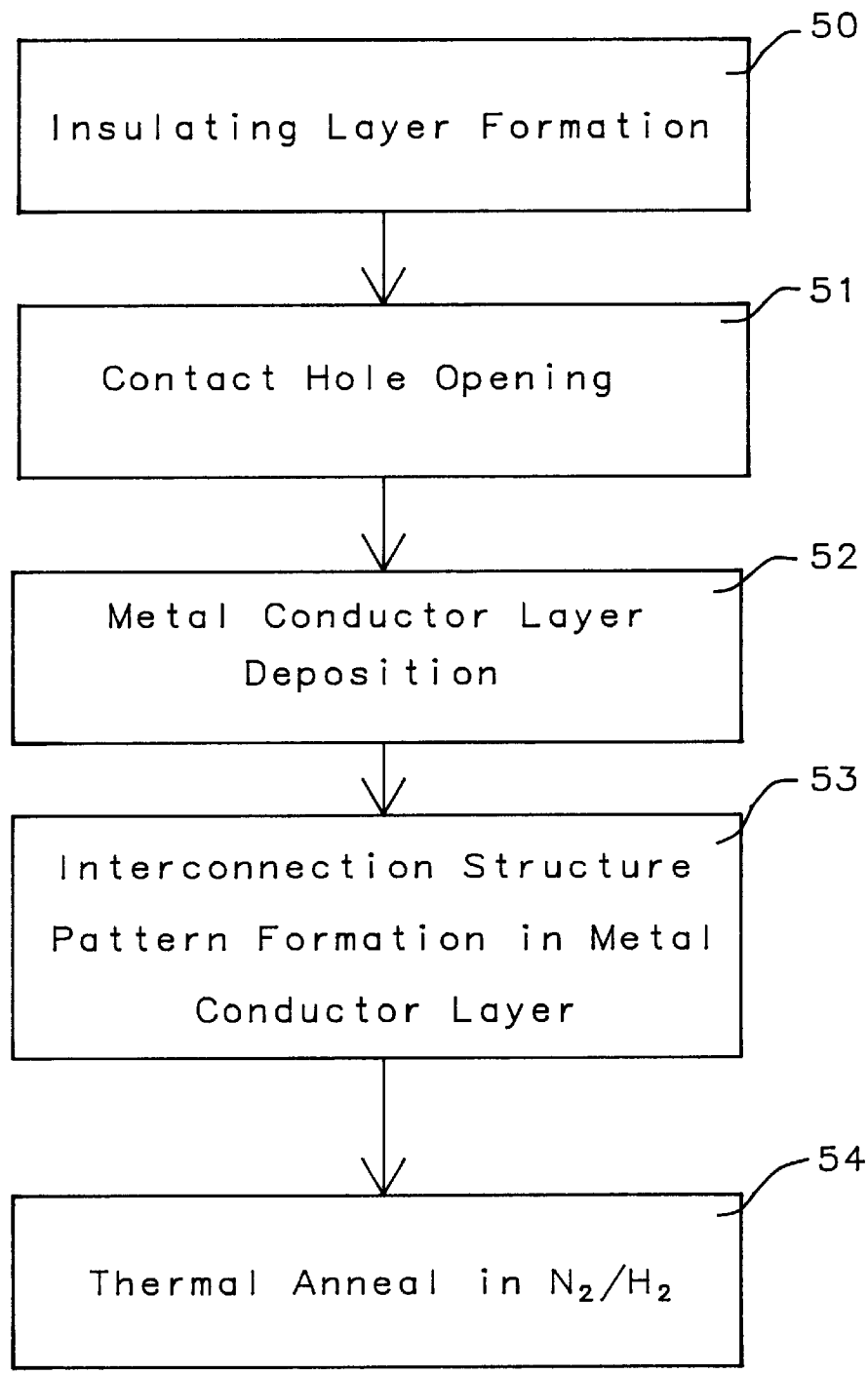
FIG. 3, which is a flow chart of the preferred embodiment of the present invention.

The increased mean refresh time, which results when the intreconnection structure pattern is annealed in a gas mixture of nitrogen and hydrogen, results in improved DRAM cell functionality. The anneal step should be at a temperature of at least 400° C., and may be at a temperature between about 400 and 500° C. The anneal time is not critical. A time of 30 min or longer results in longer mean refresh time. The anneal step is easily implemented, at low cost, in the fabrication process flow and does not negatively impact DRAM device parameters. FIG. 3 is a flow chart of the improved process.

Following the anneal step in the flowing gas mixture of nitrogen and hydrogen, a cleaning step may be applied to the semiconductor substrate. The cleaning may be performed in an ultrasonic bath, as is conventional to semiconductor integrated circuit manufacturing processes.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a tungsten interconnection structure on a semiconductor substance containing DRAM devices, comprising the steps of:

providing said semiconductor substrate containing DRAM devices;

forming an insulating layer comprising silicon oxide on said semiconductor substrate;

forming contact holes in said insulating layer comprising silicon oxide, exposing a plurality of underlying regions of said DRAM devices;

depositing a tungsten layer deposited by a CVD process, at a temperature between about 300° and 500° C., to a thickness between about 2000 and 8000 Angstroms, using $WF_6$ gas at a flow between about 5 and 200 sccm on said insulation layer comprising silicon oxide and said underlying regions to substantially cover said insulation layer comprising silicon oxide and said underlying regions;

forming an interconnection structure pattern in said tungsten layer deposited by a CVD process, at a temperature between about 300° and 500° C., to thickness between about 2000 and 8000 Angstroms, using $WF_6$ gas at a flow between about 5 and 200 sccm; and applying a thermal process comprising heat treatment at a temperature between about 400° and 500° C. for a time between about 30 and 90 min. in a flowing gas mixture of nitrogen and hydrogen having a flow rate of nitrogen between about 5 and 30 slm and a flow rate of hydrogen between about 0.5 and 5 slm.

2. A method of fabrication of an aluminum interconnection structure of semiconductor substrate containing DRAM devices, comprising the steps of:

providing said semiconductor substrate containing DRAM devices;

forming an insulation layer comprising silicon oxide on said semiconductor substrate;

forming contact holes in said insulating layer comprising silicon oxide, exposing a plurality of underlying regions of said DRAM devices;

depositing an aluminum layer to thickness between about 2000 and 10,000 Angstroms on said insulating layer comprising silicon oxide and said underlying regions to substantially cover said insulation layer comprising silicon oxide and said underlying regions;

forming an interconnection structure pattern in said aluminum layer having a thickness between about 2000 and 10,000 Angstroms; and applying a thermal process comprising heat treatment at a temperature between about 400° and 500° C. for a time between about 30 and 90 min. in a flowing gas mixture of nitrogen and hydrogen having a flow rate of nitrogen between about 5 and 30 slm and a flow rate of hydrogen between about 0.5 and 5 slm.

* * * * *